(12) United States Patent
Patterson

(10) Patent No.: US 8,263,494 B2
(45) Date of Patent: Sep. 11, 2012

(54) METHOD FOR IMPROVED PATTERNING ACCURACY FOR THIN FILM PHOTOVOLTAIC PANELS

(75) Inventor: Frank Patterson, Pleasanton, CA (US)

(73) Assignee: Stion Corporation, San Jose, CA (US)

( * ) Notice: Subject to any disclaimer, the term of this patent is extended or adjusted under 35 U.S.C. 154(b) by 0 days.

(21) Appl. No.: 13/006,710

(22) Filed: Jan. 14, 2011

(65) Prior Publication Data

US 2011/0256661 A1  Oct. 20, 2011

Related U.S. Application Data

(60) Provisional application No. 61/298,185, filed on Jan. 25, 2010.

(51) Int. Cl.
  *H01L 21/44* (2006.01)
(52) U.S. Cl. .................. 438/669; 257/E31.003
(58) Field of Classification Search .............. 438/95, 438/102, 799, 699; 427/75; 257/E31.003
  See application file for complete search history.

(56) References Cited

U.S. PATENT DOCUMENTS

| | | | |
|---|---|---|---|
| 3,520,732 A | 7/1970 | Nakayama et al. | |
| 3,975,211 A | 8/1976 | Shirland | |
| 4,062,038 A | 12/1977 | Cuomo et al. | |
| 4,332,974 A | 6/1982 | Fraas | |
| 4,335,266 A | 6/1982 | Mickelsen et al. | |
| 4,441,113 A | 4/1984 | Madan | |
| 4,442,310 A | 4/1984 | Carlson et al. | |
| 4,461,922 A | 7/1984 | Gay et al. | |
| 4,465,575 A | 8/1984 | Love et al. | |
| 4,471,155 A | 9/1984 | Mohr et al. | |
| 4,499,658 A | 2/1985 | Lewis | |
| 4,507,181 A | 3/1985 | Nath et al. | |
| 4,517,403 A | 5/1985 | Morel et al. | |
| 4,518,855 A | 5/1985 | Malak | |
| 4,532,372 A | 7/1985 | Nath et al. | |
| 4,542,255 A | 9/1985 | Tanner et al. | |
| 4,581,108 A | 4/1986 | Kapur et al. | |
| 4,589,194 A | 5/1986 | Roy | |
| 4,598,306 A | 7/1986 | Nath et al. | |

(Continued)

FOREIGN PATENT DOCUMENTS

AU  1998/7865198  2/1999

(Continued)

OTHER PUBLICATIONS

Baumann, A., et al., Photovoltaic Technology Review, presentation Dec. 6, 2004, 18 pages.

(Continued)

*Primary Examiner* — William D Coleman
*Assistant Examiner* — Christine Enad
(74) *Attorney, Agent, or Firm* — Kilpatrick Townsend & Stockton LLP

(57) ABSTRACT

A method for patterning a thin film photovoltaic panel on a substrate characterized by a compaction parameter. The method includes forming molybdenum material overlying the substrate and forming a first plurality of patterns in the molybdenum material to configure a first patterned structure having a first inter-pattern spacing. Additionally, the method includes forming a precursor material comprising at least copper bearing species and indium bearing species overlying the first patterned structure. Then the substrate including the precursor material is subjected to a thermal processes to form at least an absorber structure.

18 Claims, 7 Drawing Sheets

U.S. PATENT DOCUMENTS

| | | |
|---|---|---|
| 4,599,154 A | 7/1986 | Bender et al. |
| 4,611,091 A | 9/1986 | Choudary et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,705,912 A | 11/1987 | Nakashima et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,798,660 A | 1/1989 | Ermer et al. |
| 4,816,082 A | 3/1989 | Guha et al. |
| 4,816,420 A | 3/1989 | Bozler et al. |
| 4,837,182 A | 6/1989 | Bozler et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmom et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,261,968 A | 11/1993 | Jordan |
| 5,298,086 A | 3/1994 | Guha et al. |
| 5,336,623 A | 8/1994 | Sichanugrist et al. |
| 5,346,853 A | 9/1994 | Guha et al. |
| 5,397,401 A | 3/1995 | Toma et al. |
| 5,445,847 A | 8/1995 | Wada |
| 5,474,939 A | 12/1995 | Pollock et al. |
| 5,501,744 A | 3/1996 | Albright et al. |
| 5,512,107 A | 4/1996 | Van den Berg |
| 5,528,397 A | 6/1996 | Zavracy et al. |
| 5,536,333 A | 7/1996 | Foote et al. |
| 5,578,103 A | 11/1996 | Araujo et al. |
| 5,578,503 A | 11/1996 | Karg et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,726,065 A | 3/1998 | Szlufcik et al. |
| 5,738,731 A | 4/1998 | Shindo et al. |
| 5,868,869 A | 2/1999 | Albright et al. |
| 5,977,476 A | 11/1999 | Guha et al. |
| 5,981,868 A | 11/1999 | Kushiya et al. |
| 5,985,691 A | 11/1999 | Basol et al. |
| 6,040,521 A | 3/2000 | Kushiya et al. |
| 6,048,442 A | 4/2000 | Kushiya et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,166,319 A | 12/2000 | Matsuyama |
| 6,172,297 B1 | 1/2001 | Hezel et al. |
| 6,258,620 B1 | 7/2001 | Morel et al. |
| 6,294,274 B1 | 9/2001 | Kawazoe et al. |
| 6,307,148 B1 | 10/2001 | Takeuchi et al. |
| 6,328,871 B1 | 12/2001 | Ding et al. |
| RE37,512 E | 1/2002 | Szlufcik et al. |
| 6,361,718 B1 | 3/2002 | Shinmo et al. |
| 6,372,538 B1 | 4/2002 | Wendt et al. |
| 6,423,565 B1 | 7/2002 | Barth et al. |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,692,820 B2 | 2/2004 | Forrest et al. |
| 6,784,492 B1 | 8/2004 | Morishita |
| 6,852,920 B2 | 2/2005 | Sager et al. |
| 6,878,871 B2 | 4/2005 | Scher et al. |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B1 * | 6/2007 | Buller et al. .............. 136/251 |
| 7,252,923 B2 | 8/2007 | Kobayashi |
| 7,265,037 B2 | 9/2007 | Yang et al. |
| 7,319,190 B2 | 1/2008 | Tuttle |
| 7,364,808 B2 | 4/2008 | Sato et al. |
| 7,442,413 B2 | 10/2008 | Zwaap et al. |
| 7,544,884 B2 | 6/2009 | Hollars |
| 7,736,755 B2 | 6/2010 | Igarashi et al. |
| 7,741,560 B2 | 6/2010 | Yonezawa |
| 7,855,089 B2 | 12/2010 | Farris, III et al. |
| 7,863,074 B2 | 1/2011 | Wieting |
| 7,910,399 B1 | 3/2011 | Wieting |
| 7,955,891 B2 | 6/2011 | Wieting |
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 8,017,860 B2 | 9/2011 | Lee |
| 8,142,521 B2 | 3/2012 | Wieting |
| 2002/0002992 A1 | 1/2002 | Kariya et al. |
| 2002/0004302 A1 | 1/2002 | Fukumoto et al. |
| 2002/0061361 A1 | 5/2002 | Nakahara et al. |
| 2002/0063065 A1 | 5/2002 | Sonoda et al. |
| 2003/0075717 A1 | 4/2003 | Kondo et al. |
| 2003/0089899 A1 | 5/2003 | Lieber et al. |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0187917 A1 | 9/2004 | Pichler |
| 2004/0245912 A1 | 12/2004 | Thurk et al. |
| 2004/0252488 A1 | 12/2004 | Thurk |
| 2004/0256001 A1 | 12/2004 | Mitra et al. |
| 2005/0074915 A1 | 4/2005 | Tuttle et al. |
| 2005/0098205 A1 | 5/2005 | Roscheisen et al. |
| 2005/0109392 A1 | 5/2005 | Hollars |
| 2005/0164432 A1 | 7/2005 | Lieber et al. |
| 2005/0194036 A1 | 9/2005 | Basol |
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0130890 A1 | 6/2006 | Hantschel et al. |
| 2006/0160261 A1 | 7/2006 | Sheats et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0006914 A1 | 1/2007 | Lee |
| 2007/0089782 A1 | 4/2007 | Scheuten et al. |
| 2007/0151596 A1 | 7/2007 | Nasuno et al. |
| 2007/0163643 A1 | 7/2007 | Van Duren et al. |
| 2007/0169810 A1 | 7/2007 | Van Duren et al. |
| 2007/0209700 A1 | 9/2007 | Yonezawa et al. |
| 2008/0029154 A1 | 2/2008 | Mishtein et al. |
| 2008/0041446 A1 | 2/2008 | Wu et al. |
| 2008/0092945 A1 | 4/2008 | Munteanu et al. |
| 2008/0092953 A1 | 4/2008 | Lee |

| | | | |
|---|---|---|---|
| 2008/0121264 A1 | 5/2008 | Chen et al. | |
| 2008/0121277 A1 | 5/2008 | Robinson et al. | |
| 2008/0204696 A1* | 8/2008 | Kamijima | 355/77 |
| 2008/0210303 A1 | 9/2008 | Lu et al. | |
| 2008/0280030 A1 | 11/2008 | Van Duren et al. | |
| 2009/0021157 A1 | 1/2009 | Kim et al. | |
| 2009/0087940 A1 | 4/2009 | Kushiya | |
| 2009/0087942 A1 | 4/2009 | Meyers | |
| 2009/0145746 A1 | 6/2009 | Hollars | |
| 2009/0217969 A1 | 9/2009 | Matsushima et al. | |
| 2009/0234987 A1 | 9/2009 | Lee et al. | |
| 2009/0235983 A1 | 9/2009 | Girt et al. | |
| 2009/0235987 A1 | 9/2009 | Akhtar et al. | |
| 2009/0293945 A1 | 12/2009 | Peter | |
| 2010/0081230 A1 | 4/2010 | Lee | |
| 2010/0087016 A1 | 4/2010 | Britt et al. | |
| 2010/0087026 A1 | 4/2010 | Winkeler et al. | |
| 2010/0096007 A1 | 4/2010 | Mattmann et al. | |
| 2010/0101648 A1 | 4/2010 | Morooka et al. | |
| 2010/0101649 A1 | 4/2010 | Huignard et al. | |
| 2010/0122726 A1 | 5/2010 | Lee | |
| 2010/0197051 A1 | 8/2010 | Schlezinger et al. | |
| 2010/0210064 A1 | 8/2010 | Hakuma et al. | |
| 2010/0233386 A1* | 9/2010 | Krause et al. | 427/596 |
| 2010/0267190 A1 | 10/2010 | Hakuma et al. | |
| 2011/0070682 A1 | 3/2011 | Wieting | |
| 2011/0070683 A1 | 3/2011 | Wieting | |
| 2011/0070684 A1 | 3/2011 | Wieting | |
| 2011/0070685 A1 | 3/2011 | Wieting | |
| 2011/0070686 A1 | 3/2011 | Wieting | |
| 2011/0070687 A1 | 3/2011 | Wieting | |
| 2011/0070688 A1 | 3/2011 | Wieting | |
| 2011/0070689 A1 | 3/2011 | Wieting | |
| 2011/0070690 A1 | 3/2011 | Wieting | |
| 2011/0073181 A1 | 3/2011 | Wieting | |

FOREIGN PATENT DOCUMENTS

| | | |
|---|---|---|
| AU | 2001/40599 A1 | 8/2001 |
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | 2006/126598 A1 | 11/2006 |
| WO | 2007/022221 A2 | 2/2007 |
| WO | 2007/077171 A2 | 7/2007 |
| WO | 2008/025326 A2 | 3/2008 |

OTHER PUBLICATIONS

Chopra et al., "Thin-Film Solar Cells: An Overview", 2004, Progress in Photovoltaics: Research and Applications, 2004, vol. 12, pp. 69-92.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Guillen C., "CuInS2 Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of $CuIn_{1-x}Ga_xSe_2$ Solar Cells on Rigid and Flexible Substrates using Nanoparticle Precursor Inks", Thin Solid Films, 2003, vol. 431-432, pp. 53-57.

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Metha et al., "A graded diameter and oriented nanorod-thin film structure for solar cell application: a device proposal", Solar Energy Materials & Solar Cells, 2005, vol. 85, pp. 107-113.

Onuma et al., Preparation and Characterization of CuInS2 Thin Films Solar Cells with Large Grain, Elsevier Science B.V; Solar Energy Materials & Solar Cells 69 (2001) pp. 261-269.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/ Polymer Composite Doped with Tetraphenylbenzidine Single Layer Structure Light-emitting Diode", Applied Physics Letters, vol. 69, No. 3, Jul. 15, 1996, pp. 377-379.

* cited by examiner

METHOD FOR IMPROVED PATTERNING ACCURACY FOR THIN FILM PHOTOVOLTAIC PANELS

CROSS-REFERENCE TO RELATED APPLICATION

This application claims priority to U.S. Provisional Patent Application No. 61/298,185, filed Jan. 25, 2010, entitled "Method for Improved Patterning Accuracy for Thin Film Photovoltaic Panels" by inventor Frank Patterson, commonly assigned and incorporated by reference herein for all purposes.

BACKGROUND OF THE INVENTION

The present invention relates generally to photovoltaic materials and manufacturing method. More particularly, the present invention provides a method and structure for patterning thin film photovoltaic panels with improved accuracy. Merely by way of example, the present method and structure include forming a first series of patterns with pre-compensated inter-pattern spacing followed by additional series of patterns after substrate compaction in thermal processing. The method is applied to a thin-film stack for manufacturing copper indium diselenide based thin film photovoltaic devices, but it would be recognized that the invention may have other configurations.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in Calif. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other.

BRIEF SUMMARY OF THE INVENTION

Embodiments according to the present invention relate to photovoltaic materials and manufacturing methods. More particularly, the present invention provides a method and structure for patterning thin film photovoltaic panels with improved accuracy. Merely by way of example, the present method and structure include forming a first series of patterns with pre-compensated inter-pattern spacing followed by forming a second series of patterns after substrate compaction in thermal processing. The method is applied to a thin-film stack for manufacturing copper indium diselenide based thin film photovoltaic panel devices, but it would be recognized that the invention may have other configurations.

In a specific embodiment, a method for patterning a thin film photovoltaic panel is provided. The method includes providing a substrate having a first edge opposing to a second edge. The substrate is characterized by a compaction parameter. The method further includes forming a molybdenum material overlying the substrate. Additionally, the method includes forming a first plurality of patterns in the molybdenum material configured in a spatial configuration having a first inter-pattern spacing from the first edge to the second edge to form a first patterned structure overlying the substrate. The method further includes forming a precursor material comprising at least copper bearing species and indium bearing species overlying the first patterned structure. Furthermore, the method includes subjecting the substrate including the first patterned structure overlaid by the precursor material to one or more thermal processes to form at least an absorber structure and cause the substrate to change in dimension associated with the compaction parameter and subsequently to change the first inter-pattern spacing with respect to a second inter-pattern spacing formed after the afore-mentioned thermal process. The method further includes forming a window material overlying the absorber structure. Moreover, the method includes scribing at least through one or more portions of the window material and the absorber structure at a position on the substrate shifted by a predetermined distance from one of the first plurality of patterns to cause formation of a second plurality of patterns characterized by a third inter-pattern spacing.

In another specific embodiment, a method is provided for pre-compensating patterns on thin film panels. The method includes providing a glass substrate characterized by a compaction ratio depended on one or more thermal cycles. The method further includes forming a first film overlying the glass substrate and forming a first patterned structure in the first film characterized by a first plurality of patterns having a first inter-pattern spacing pre-compensated by the compaction ratio. Additionally, the method includes forming at least a second film overlying the first patterned structure. The method further includes processing the second film through the one or more thermal cycles. The one or more thermal cycles transform the first inter-pattern spacing to a second inter-pattern spacing as the substrate is subjected to a compaction based on the compaction ratio. Furthermore, the method includes scribing at least two or more portions of the second film to form a second plurality of patterns using a scribe device including two or more mechanical tips having a pre-determined tip-tip separation substantially equal to the second inter-pattern spacing. Each of the second plurality of patterns is respectively shifted a distance from one of the first plurality of patterns.

Many benefits can be achieved by applying the embodiments of the present invention. Particularly, the method provides a method for patterning a thin film photovoltaic panel device with improved cell-spacing accuracy. By taking account a physical compaction of the substrate due to a predetermined thermal process, patterning of the thin film on the substrate before the thermal process can be transformed in a controlled fashion after going through the thermal process. Patterning of the thin film panel after the thermal process then can then be simplified using a mechanical scriber with multiple fixed tips. Each tip can be pivoted and applied a desired force to scribe a predetermined depth through a window layer and/or the absorber layer of the photovoltaic film stack for patterning each of a plurality of photovoltaic cells on the substrate. Preferably, the first series of patterns are performed using laser scribing with predetermined positioning to make proportional expanded inter-pattern spacing based on a compaction parameter of the substrate. The proportional expansion of the inter-pattern spacing then is substantially compensated following the thermal process for absorber layer to provide uniformly spaced patterns. In an embodiment, the second (or more) series of patterns can be, formed by mechanical scribing, for example, four or more equally spaced pivoted tips. The patterning process performed according to embodiments of the invention results in a well defined electrical connection structure for each photovoltaic cell substantially without wasting the spatial region between patterns for non photovoltaic function, thus greatly enhancing the cell efficiency.

DETAILED DESCRIPTION OF THE INVENTION

Embodiments according to the present invention relates to photovoltaic materials and manufacturing method. More particularly, the present invention provides a method and structure for patterning thin film photovoltaic panels with improved accuracy. Merely by way of example, the present method and structure include forming a first series of patterns with pre-compensated inter-pattern spacing followed by a second series of patterns after substrate compaction in thermal processing. The method is applied to a thin-film stack for manufacturing copper indium diselenide based thin film photovoltaic devices, but it would be recognized that the invention may have other configurations.

Figure 1A:
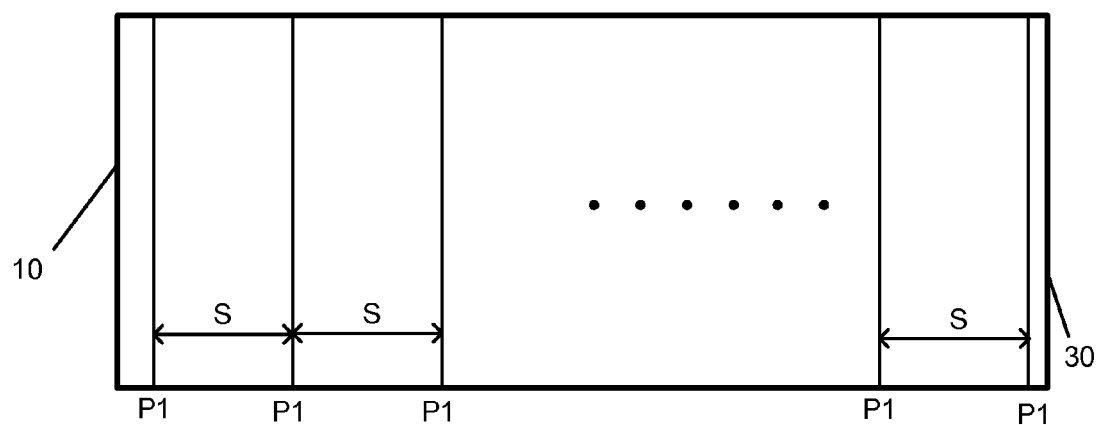
FIGS. 1A, 1B, and 1C are simplified diagrams showing undesired pattern shifting due to substrate thermal compaction in prior arts.

The state of art manufacturing process of thin film based photovoltaic cell requires multiple stages of patterning process to scribe line patterns for a plurality of cells formed on a large substrate panel. Each cell usually is designed to cover a same spatial area of the panel so that patterning can be done for multiple cells at the same time to simplify the process with a fixed inter-pattern spacing. FIG. 1A shows a top view of a portion of a substrate from a first edge region 10 to a second edge region 30 on which a series of line patterns P1 is formed. The inter-pattern spacing S between any neighboring patterns P1 is substantially the same. The patterns P1 are scribed into an electrode layer, for example, a molybdenum material to form a patterned structure. Over the patterned structure a photovoltaic absorber will be added.

Figure 1B:
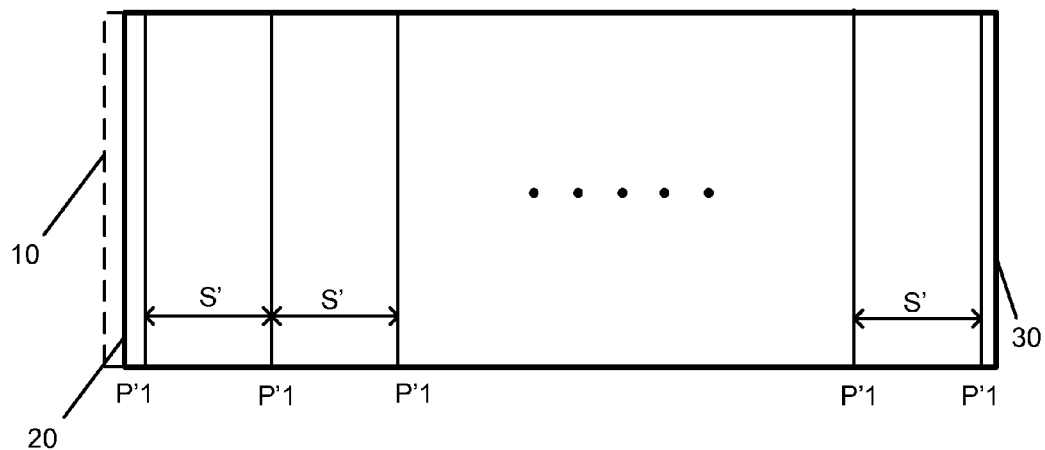

A typical method for forming the absorber includes adding a precursor material and performing one or more thermal treatment processes during or after adding the precursor material. FIG. 1B shows the same portion of patterned substrate panel after the one or more thermal treatment processes which may need to anneal the substrate up to a temperature approaching the glass strain point. For example, the anneal point may be near 530 Degree Celsius. For an as-formed glass material which is true for typical glass based substrates used for manufacture of thin film photovoltaic devices, one expects it to compact after going through the annealing. As shown in Figure B, a thermally caused substrate compaction occurs. For example, using the second edge region as a reference point, the first edge region of the substrate is shifted to from position 10 to position 20. Correspondingly each of the series of line patterns P1 within the patterned structure is shifted in position to a series of line patterns P'1 with a changed inter-pattern spacing (typically shrinks) For example, the P1-P1 spacing S is changed to P'1-P'1 spacing S' after the one or more thermal process causing the substrate compaction. The glass material, for example soda lime glass used for making a thin film photovoltaic panel, usually has isotropic physical properties so that the compaction may be substantially uniform throughout the substrate. The compaction parameter which is defined as a percentage change in dimension in this case is substantially a position independent constant.

Figure 1C:
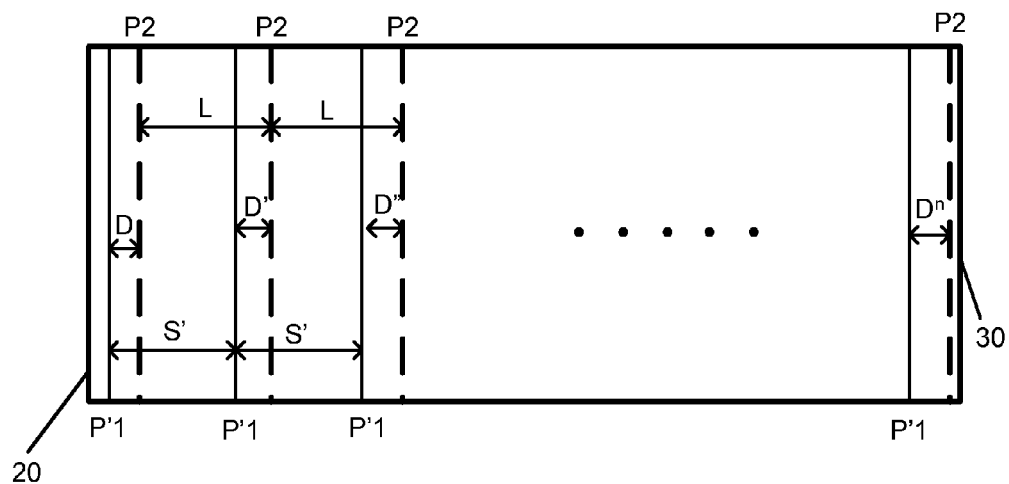
Figure 1D:
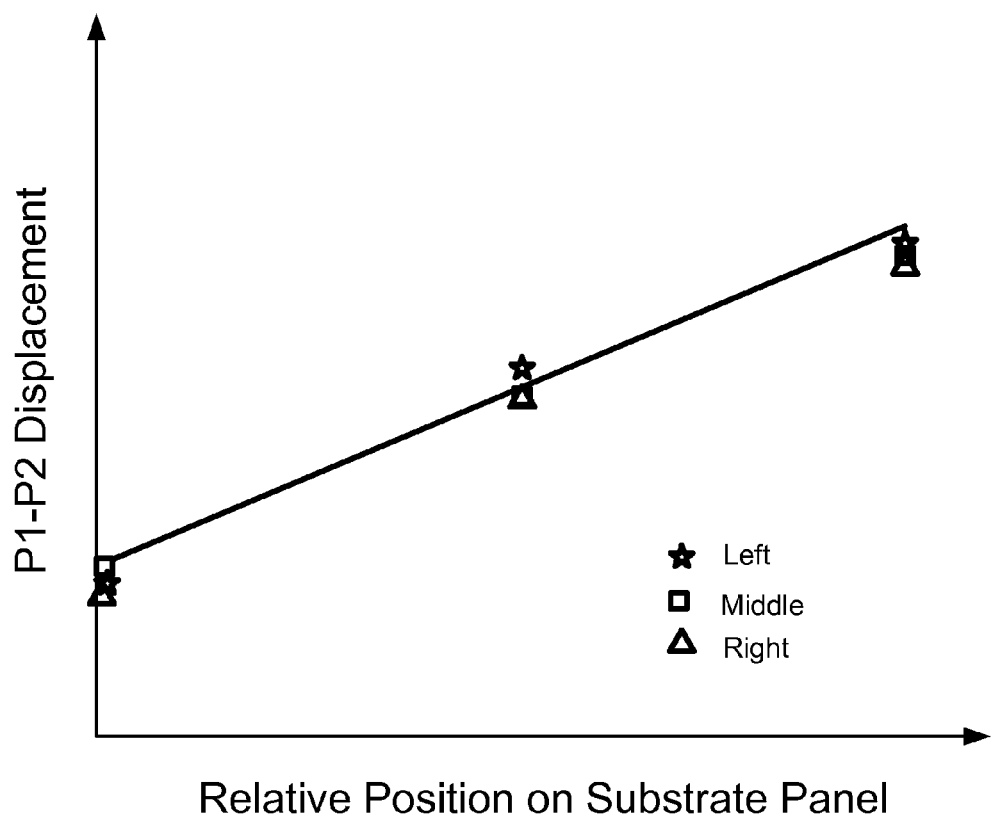
FIG. 1D is an exemplary diagram illustrating a plot of first pattern to second pattern displacement versus position on a substrate panel according to an embodiment of the present invention.

Other processes are followed, including forming a window material overlying the absorber and additional patterning process is performed to form another patterned structure through the film including the window material and the absorber. A convenient method is to use a scribe device comprising multiple mechanical tips having a fixed and predetermined tip-tip separation. The tip-tip separation L is designed to be the same as the P1-P1 spacing S for forming one pattern for each individual cell when scribing the multiple tips into the film on the substrate. For example, FIG. 1C shows another series of line patterns P2 are formed by the scribe device mentioned above. A pattern P2 is supposed to be scribed by disposing a tip to a location that shifts a lateral distance D away from a first pattern P1. However, because the patterns P1 have been shifted due to the substrate compaction, the P1-P1 spacing S changes to P'1-P'1 spacing S', and S' is smaller now than P2-P2 spacing L. This results in a varying P1-P2 spacing D. For example, using a pattern P1 next to the first edge region 20 as a reference point a pattern P2 is scribed at a distance D away from P1. Other P2 patterns are multiple of L spaced away this pattern P2. From the first edge region 20 to the second edge region 30, the P1-P2 spacing becomes larger and larger (D">D'>D), causing extra spatial regions between those P1 and P2 which are wasted since they are not beneficial for photovoltaic function and correspondingly poor efficiency of the photovoltaic device. In case the P2 is scribed at a distance shifted away from P1 in an opposite direction, the changed P1-P1 inter-pattern spacing may result in a smaller and smaller P1-P2 spacing, which increases possibility of electrical shorting of the electrical link and device failure.

Figure 2:
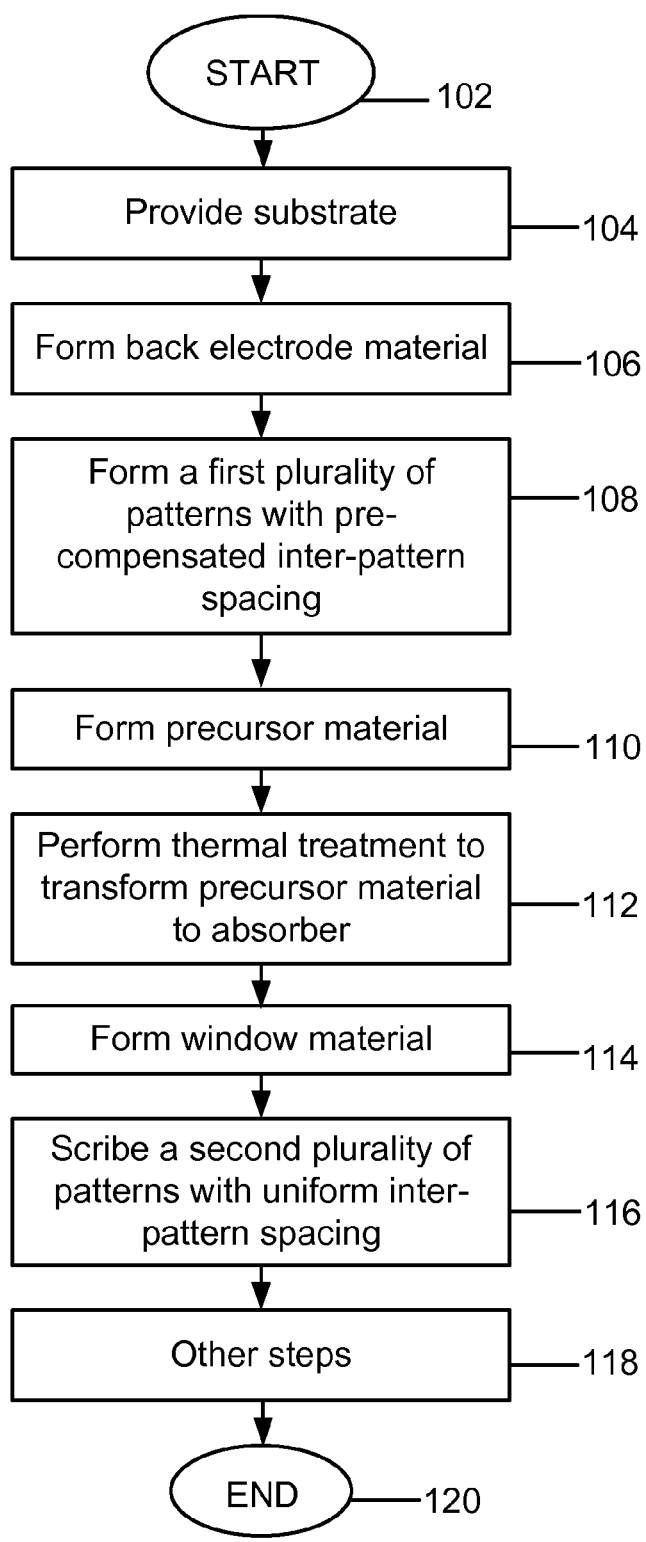
FIG. 2 is a simplified process flow diagram illustrating a method of patterning a thin film photovoltaic panel according to an embodiment of the present invention.

FIG. 2B provides an exemplary plot of P1-P2 displacement versus its relative position on a sample substrate. All patterns are included across the substrate from left, middle, to right and the result shows a substantial linear relationship. The slope of the fitted line gives a value of the compaction parameter for this sample substrate panel, or eventually used as a reference parameter for all substrate panels from a same manufacture lot. The specific value of the compaction parameter depends on the particular substrate material and its thermal history. For example, a typical soda lime glass substrate may be associated with a compaction parameter of about 500 ppm when the glass substrate has experienced a thermal annealing that approaches an anneal point of about 530 Degrees Celsius.

Embodiments of the present invention is aimed to overcome the short coming of the varying P1-P2 (or P1-P3 for additionally patterning) spacing caused by thermally induced uneven shifting. FIG. 2A is a simplified process flow diagram illustrating a method for patterning a thin film photovoltaic cell according to an embodiment of the present invention. As shown the method begins with a Start step (Step 102). The method includes providing a substrate (Step 104). The substrate can be a transparent material such as a glass. In a specific embodiment, a soda lime glass substrate is used. In particular, the substrate may be just one of many substrates from a same manufacturing lot having substantially the same thermal history. When these substrates are subjected to one or more predetermined thermal processes, they will likely experience similar deformation or change in dimension, for example, a physical compaction after going through the one or more thermal processes. In a specific embodiment, one or more sample substrates can be selected from the manufacturing lot to measure their geometric dimension before/after the one or more predetermined thermal processes, from which a compaction parameter associated with the substrate compaction can be determined. It is found that for soda lime glass the compaction parameter is substantially a constant for a particular manufacturing lot which is independent of position on the substrate. This means that the substrate compaction is substantially a uniform deformation where its dimension changes linearly. For a typical soda lime glass substrate, the amount of compaction can be measured by a Dilatometer before/after it is subjected to the one or more thermal processes. The results indicate that a compaction parameter of a soda lime glass is between 500 ppm to 600 ppm for an anneal point of about 530° C. Of course, there can be many variations, modifications, and alternatives. For example, the compaction parameter may be position dependent so that the substrate changes non-linearly in dimension from a first edge to a second edge. However, the compaction parameter as a function of relative position on the substrate can be still predetermined using a sample substrate subjecting to the corresponding thermal process.

Referring to FIG. 2A, embodiments of the present method further include forming a back electrode material overlying the substrate (Step 106). The back electrode material can be provided by a conductive material including metal and transparent conductive oxide. In a specific embodiment a molybdenum film is formed. Other metal materials may also be used, depending on the application. The method includes forming a first plurality of patterns (Step 108) into the back electrode material with a pre-compensated inter-pattern spacing. The compaction parameter deduced earlier is used to determine a pattern position. In particular, after a first pattern is in place, the next pattern is determined to be positioned at a standard distance (e.g., a predetermined cell dimension) away from the first pattern plus a pre-compensated shift proportional to the compaction parameter. For each of following patterns, the above procedure is simply repeated. In other words, a first patterned structure is formed in the back electrode material overlying the substrate and is configured to have an inter-pattern spacing set to be bigger than a standard cell dimension as a compensation for upcoming substrate compaction. In a specific embodiment, the pre-compensated inter-pattern spacing is still substantially uniform provided that the compaction parameter is a position-independent constant. If the compaction parameter is position dependent, the inter-pattern spacing may be adjusted for each pattern accordingly. In another specific embodiment, focused laser beam is employed to perform the patterning for forming a first plurality of patterns with pre-compensated inter-pattern spacing, because the focused laser beam can be accurately positioned spatially so as to accomplish the spatial pre-compensation of the patterning process throughout the whole substrate panel.

Additionally, a precursor material can be formed overlying the back electrode material (Step 110), after the first plurality of patterns are formed in parallel having a first inter-pattern spacing proportionally expanded based on the compaction parameter from the first edge or the second edge of the substrate. The precursor material includes all materials needed for forming a photovoltaic absorber structure. In an embodiment, the precursor material includes copper species, indium species, and/or gallium species. These precursor material species can be deposited at relative low temperature using sputtering technique or other thin film deposition method to form a composite film ready for being transformed into a photovoltaic absorber by additionally processes.

The method then includes performing one or more thermal treatment processes to transform the precursor material to a absorber structure (Step 112). In a specific embodiment, this includes a SAS (selenization and sulfurization) process by subjecting the substrate with the precursor material overlying the first patterned structure to an environment comprising selenium gaseous species and sulfur species. In that environment, the precursor material reacts with the selenium work gas under a predetermined temperature ramping profile. In the embodiment, the resulted photovoltaic absorber structure comprises a p-type copper-indium-diselenide compound semiconductor with multi-grain chalcopyrite structure. Following this step, a window material can be added overlying the absorber structure (Step 114). In a specific embodiment, the window material includes cadmium sulfide material. In certain other embodiments, the window material can be made of transparent oxide with desired n-type doping levels. More details about the formation of the absorber structure by applying the SAS thermal treatment process to a precursor material under a predetermined temperature profile and subsequent window material formation can be found in U.S. Patent application No. 61/101,635, titled "LARGE SCALE METHOD AND FURNACE SYSTEM FOR SELENIZATION OF THIN FILM PHOTOVOLTAIC MATERIALS" filed on Sep. 30, 2008 by Robert Wieting, commonly assigned and incorporated for references for all purposes.

Referring to FIG. 2A again, embodiments of present invention provide a self-compensation mechanism for the first plurality of patterns after the SAS process. Since the first plurality of patterns has been pre-compensated in each of their positions when scribed using a properly positioned focused laser beam before the SAS process, the substrate compaction effect during the SAS thermal process causes the inter-pattern spacing to return to substantially the standard cell dimension predetermined for the thin film photovoltaic device on the substrate panel. Furthermore, the method for patterning the thin film photovoltaic device includes forming a second plurality of patterns (Step 116) through the window material and absorber structure. Each of the second plurality of patterns is one-to-one associated with each of the first plurality of patterns formed in Step 108 for each strip shaped cell designed with a standard cell spatial dimension on the substrate panel. In a specific embodiment, the second plurality of patterns can be conveniently formed using a scribe device having multiple mechanical tips. For example four or more tips with equal tip-tip spacing can be installed to the scribe device. A pivoted arm can be configured to apply controllable pressure force to each tip for scribing and removing a portion of film material. The tip is composed of a proper material that is capable to remove a certain amount of film material when a proper force and a proper scanning speed are applied to the scribe device. Of course, the tip-tip spacing is chosen for making the desired inter-pattern spacing for the second plurality of patterns. In an implementation, the scribe device is disposed so that each tip is in a desired location above the film (of window material and absorber structure). Specifically, the desired tip location is set to be shifted a predetermined distance away from a position of a particular one of the first plurality of patterns. Usually, one of the first patterns, such as the one located near the first edge, can be chosen as a reference point to dispose tips of the scribe device. As the inter-pattern spacing of the first plurality of patterns has recovered from a precompensated value to a spacing substantially the same as the desired cell spatial dimension, the second plurality of patterns can be scribed conveniently in multiplication with each pattern having a predetermined displacement from any one of the first plurality of patterns. Additionally, the P1-P2 displacement is substantially uniform across the whole substrate.

After the formation of the second plurality of patterns a top electrode material can also be formed overlying the window material and filling the recessed portion of the second patterns. The method further performs other steps to complete the photovoltaic device (Step 116). These other steps may include providing interconnect elements, ribbon elements, lamination, and framing among others to complete the photovoltaic panel device. The method ends with an end step (Step 118). Of course there can be other variations, modifications, and alternatives.

The above sequence of steps provides a method of patterning and forming a photovoltaic device according to an embodiment of the present invention. As shown, the method includes a step of patterning an absorber structure and a window material using a scribe device according to a specific embodiment. Depending on the embodiment, one or more steps may be added, one or more steps may be eliminated, and one or more steps may be performed in a different sequence without departing from the scope of the claims herein. For example, after adding a transparent conductive oxide material overlying the window material, a third plurality of patterns may be performed using substantially the same scribe device having multiple mechanical tips. The tip-tip spacing can be substantially the same as that set for scribing the second plurality of patterns because it still represents a standard cell spatial dimension. Again, each of the third plurality of patterns can be shifted a (different) predetermined distance away from a corresponding one of the second plurality of patterns. In other words, each cell contains a set of three patterns that respectively serves as a structural element for forming the electric contact of the particular photovoltaic cell. Over the substrate panel, a plurality of those cells is in stripe shape distributed from the first edge to the second edge.

Figure 3:
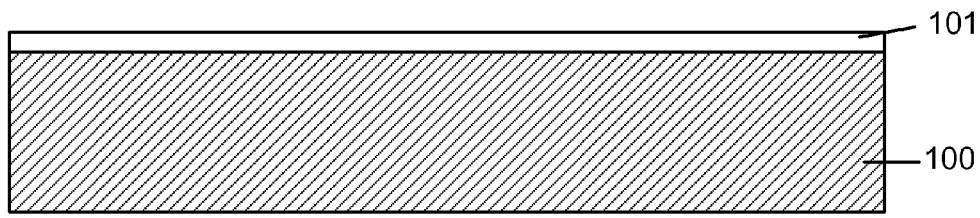
FIG. 3-10 are simplified diagrams illustrating a method of patterning a thin film photovoltaic panel according to an embodiment of the present invention.

FIGS. 3-10 are simplified diagrams illustrating a method for patterning a thin film photovoltaic panel according to an embodiment of the present invention. These diagrams are merely examples and should not unduly limit the claims herein. One skilled in the art would recognize other variations, modifications, and alternatives. As shown in FIG. 3, a substrate panel 100 is provided and overlaid by a back electrode layer 101. The substrate panel 100 can be a glass material such as soda lime glass in an embodiment. Soda lime glass is a cost effective option for a transparent substrate for manufacturing thin film photovoltaic devices. Other suitable transparent substrates such as quartz, fused silica or solar glass can also be used. In a specific embodiment, the substrate panel 100 has been characterized by a compaction parameter associated with a specific substrate material subjected to a specific thermal annealing point and can be determined using one or more sample substrates selected from a group of substrates out of a same manufacturing lot with similar thermal history. The sample substrate is subjected to one or more thermal processes having at least an anneal approaching its glass strain point. Afterwards, a dilatometer can be used for measuring a series of length scale of the substrate panel to determine the degree of compaction characterized by a compaction parameter. For typical as-formed glass material with isotropic physical properties, the substrate compaction is expected to be substantially linear or uniform. The compaction parameter is a substrate deformation ratio, a substantially position-independent constant. For example, a value of about 500 to 600 ppm is obtained for typical soda lime glass in a process with substrate temperature approaching 530° C. Given any position of the substrate, a spatial contraction would be subjected to the same compaction parameter. Of course, depending on application, certain other types of substrate material may be used, wherein the compaction parameter may be either different in value or be a function of position of the substrate. For latter situation, the spatial deformation becomes position-dependent based on the function.

The back electrode material 101 overlying the transparent substrate panel 100 may be selected from a transparent conductor oxide (TCO) such as indium tin oxide (commonly called ITO), fluorine doped tin oxide, and a metal material including molybdenum material in a specific embodiment. The molybdenum material can be formed using deposition techniques such as sputtering, plating, physical vapor deposition (including evaporation, sublimation), chemical vapor deposition (including plasma enhanced processes) following by a patterning process. Molybdenum material provides certain advantage over other electrode material for copper indium diselenide (CIS) or copper indium gallium diselenide (CIGS) based thin film photovoltaic cells. For example, molybdenum material provides a low contact resistance for CIGS film and stability over subsequent process steps. In a specific embodiment, molybdenum material is formed by depositing a first molybdenum layer overlying the transparent substrate member. The first molybdenum layer has a first thickness and a tensile characteristic in a specific embodiment. A second molybdenum layer having a compression characteristics and a second thickness is formed overlying the first molybdenum layer. In a specific embodiment, the first electrode layer comprising the molybdenum material can be further patterned as shown. Further details of deposition and patterning of the molybdenum material can be found at least in U.S. Provision Application No. 61/101,646 filed Sep. 30, 2008 and U.S. Provision Application No. 61/101,650 filed Sep. 30, 2008, commonly assigned, and hereby incorporate by reference. Of course, there can be other variations, modifications, and alternatives.

Figure 4:
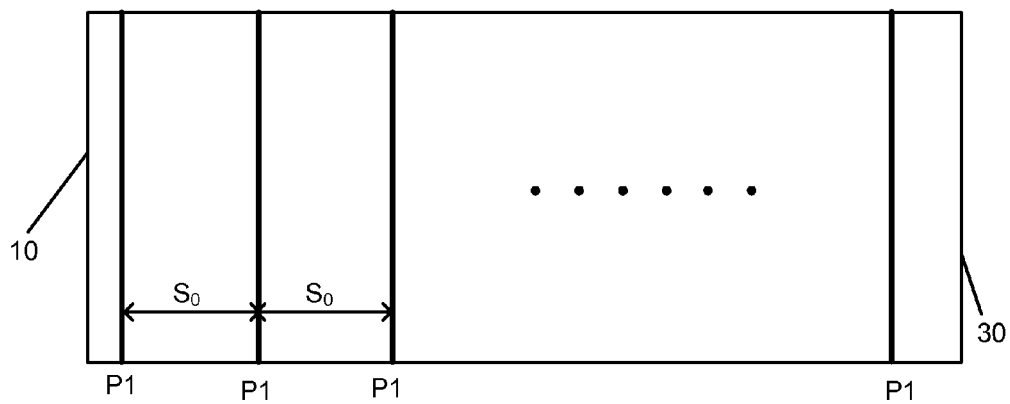
Figure 5:
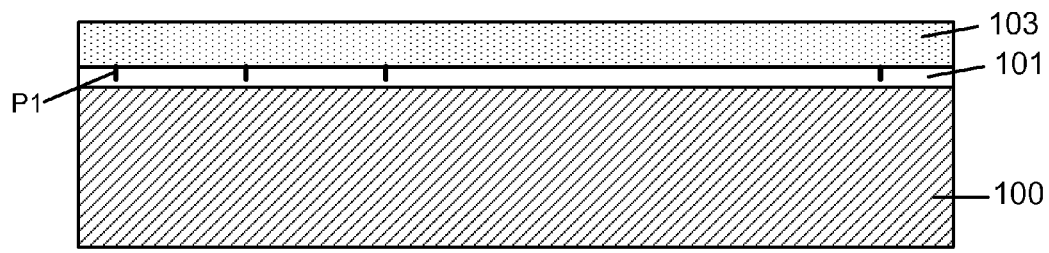
Figure 6:
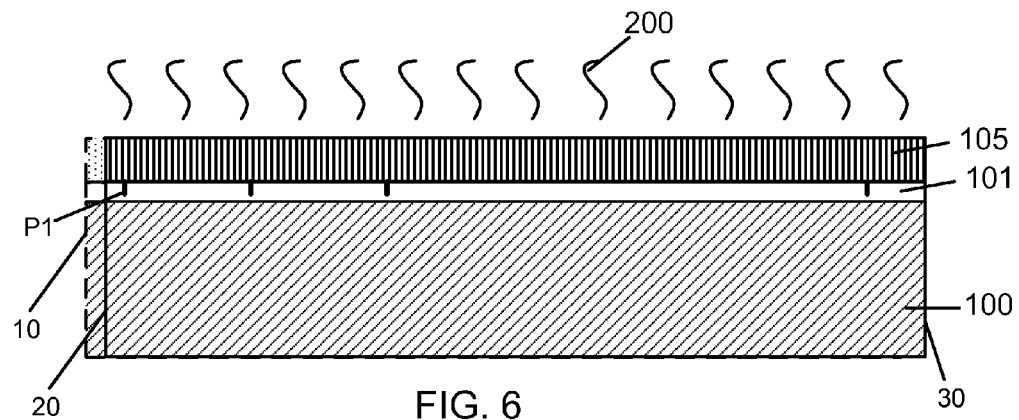

As shown in FIG. 4, the method includes forming a first plurality of patterns P1 into the back electrode material 101 overlying a portion of the substrate 100 from a first edge region 10 to a second edge region 30. In a specific embodiment, the positioning of each of the first plurality of patterns P1 is pre-compensated using the compaction parameter obtained earlier for this (type of) substrate. The inter-pattern spacing $S_0$ of P1 is intentionally expanded from a base (standard) spacing plus an extra distance based on the compaction parameter. For example, if a standard cell dimension is 6.1 mm, it is expected to be equal to the inter-pattern spacing. For a 600 ppm compaction parameter, the patterns are re-positioned so that the inter-pattern spacing is made bigger than 6.1 by an extra portion, which is for compensating a potential compaction of the substrate. That equals 600 ppm×6.1 mm=0.00336 mm. So a precompensated inter-pattern spacing $S_0$ would be selected as 6.104 mm. This inter-pattern spacing precompensation is executed through out all first plurality of patterns P1 from the first edge region 10 to the second edge region 30. In the end, a first patterned structure P1s is formed overlying the substrate panel. In a specific embodiment, the compaction parameter is more complicated (depending on substrate material) and may be a function of position on the substrate. For example, it is a function of a distance away from the first edge. Then the precompensation of the first plurality of patterns P1 needs to be adjusted accordingly so that the inter-pattern spacing may not be a constant but a changed value from the first edge region to the second edge region one after another. Of course there can be many variations, alternatives, and modifications. The patterning of the first plurality of patterns P1 can be performed using a focused laser beam which can be positioned to a desired position with high accuracy and easily controlled in spot re-positioning and beam scanning.

In an embodiment, the first plurality of patterns P1 comprises a recessed region for each pattern and will be used form back electrode contact for the photovoltaic cells. Over the back electrode material a photovoltaic absorber is to be formed. In a specific embodiment, a precursor material 103 is added overlying the electrode material 101. As shown in the cross-sectional view of FIG. 5, the precursor material 103 has fully covered the first patterned structure P1s, which comprises the first plurality of patterns P1 embedded within the back electrode material 101. The precursor material, in an embodiment, comprises copper species, indium species, and optionally gallium species deposited via sputtering techniques.

Figure 7:
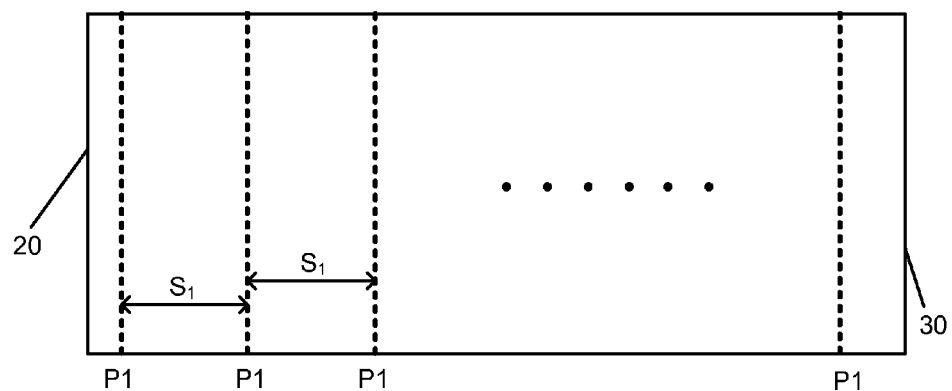

Embodiments of the method provides one or more thermal treatment processes to transform the precursor material into an absorber structure. In an embodiment, the substrate 100 covered with the precursor material 103 and embedded first plurality of patterns in the back electrode material 101 can be loaded to a chamber comprising a gaseous environment of selenium species and/or sulfur species and/or one or more inert work gases. The substrate then is subjected to one or more thermal processes 200 having a predetermined temperature profile comprising one or more ramping-up, holding, ramping-down stages to induce a reactive annealing of the precursor material 103 at desired temperatures for certain periods. At least in a certain stage the substrate temperature may approach the glass strain point of about 530° C. In a specific embodiment, the precursor material 103 with copper, indium, or gallium species is reacted with selenium species at elevated temperatures and subsequently annealed through temperatures ramping up and down and finally transformed to an absorber 105 comprising a copper-indium-gallium-diselenide compound semiconductor with chalcopyrite structure grains. The temperature profile associated with the one or more reactive thermal treatment processes 200 is substantially the same experienced by the bare sample substrate (similar to substrate 100) for determining the compaction parameter. Therefore, after the one or more thermal treatment processes the precursor material is transformed to absorber structure and at the same time the first plurality of patterns P1 is relatively re-positioned due to a compaction of the substrate 100. Shown in FIG. 6, the substrate compaction causes the first edge region of the substrate 100 to shift from position 10 to position 20 during the one or more thermal processes 200. Accordingly, since the line patterns P1 have been pre-compensated by proportionally expanding each inter-pattern spacing from a base value, the compaction process re-positions each of the patterns P1 to yield a second patterned structure with a second inter-pattern spacing $S_1$ substantially throughout the first plurality of patterns. FIG. 7 shows a top view of the panel wherein the second patterned P1 structure formed after the one or more thermal treatment processes is embedded within the back electrode material 103. Now the second patterned structure comprises the first plurality of patterns P1 but with the inter-pattern spacing $S_1$. For example, after going through the processes 200 the inter-pattern spacing $S_1$ is substantially equal to about 6.1 mm designed for each strip shaped cell on a CIGS thin film photovoltaic panel.

Figure 8:
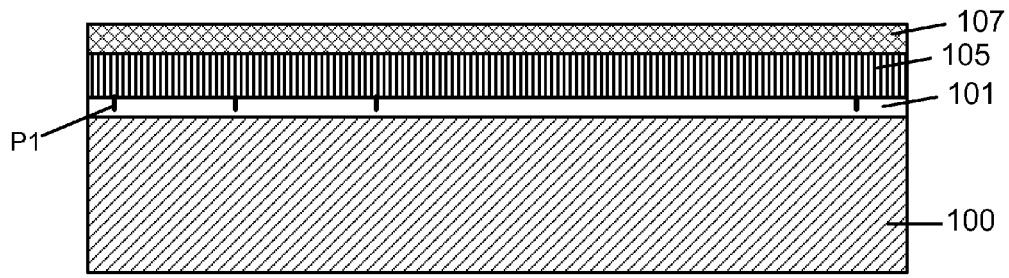

In a specific embodiment, the method further includes forming a window material 107 overlying the absorber structure 105 to form a light conversion function film for photovoltaic cells on the substrate panel, shown in FIG. 8. The window material 107 is often provided using a wide bandgap n-type semiconductor material for a p-type absorber structure 105 in a specific embodiment. In a preferred embodiment, the window material uses a cadmium sulfide overlying absorber structure comprising CIGS, CIS and related materials. The window material can be deposited using techniques such as sputtering, vacuum evaporation, chemical bath deposition, among others.

Figure 9:
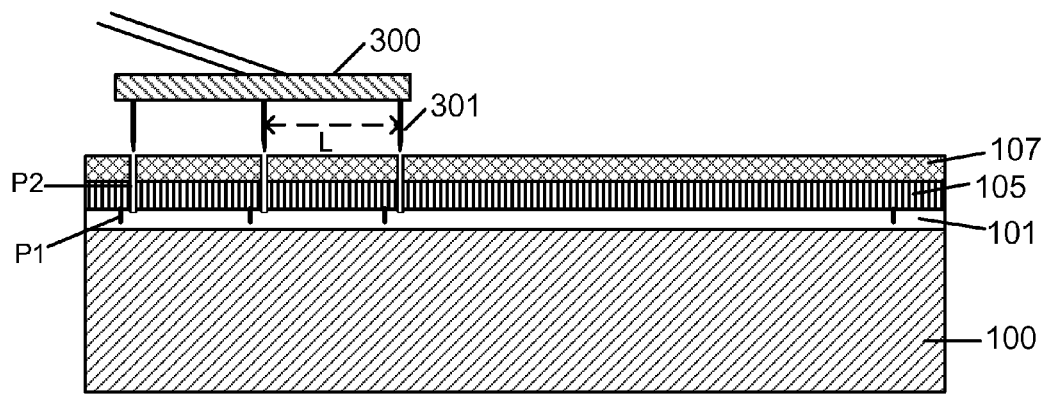

To complete the photovoltaic cell structure on the substrate panel, the method further includes patterning the photovoltaic function film for each cell. In a specific embodiment, a mechanical scribing device can be applied to perform the patterning process. The mechanical scribing device 300, as shown in FIG. 9, can include multiple tips 301 or scribe head having an equal spacing L so that one scribing action can provide patterning for multiple cells, wherein the spacing L is simply the designed standard cell spatial dimension, for example, 6.1 mm. In a specific embodiment, each tip 301 can be made of material such as diamond, tungsten carbide, or silicon carbide, and the like. Other materials having sufficient hardness may also be used for the tip depending on the application. The tip 301 is also characterized by a radius ranging from about 20 microns to about 40 microns and preferably 25 microns and more. The scribe device 300 can be a pivot device in a specific embodiment which also connects to a control device to positioning the tips and applying the desired force to the tips in a certain range of angles to form recessed patterns into the film (including window material 107 and absorber structure 105). For example, FIG. 9 shows a side view of a portion of the substrate panel with a second plurality of patterns P2 (one for each cell) scribed by the mechanical scribe device 300 using equally spaced multiple tips. In a specific embodiment, the depth of the recessed pattern is substantially equal or slightly greater than the thickness of combined window material and absorber structure. In an example, the recessed region is not surpassed 200 Angstrom into the molybdenum material under the absorber structure.

In another specific embodiment, each of the second plurality of patterns P2 is designated to be a predetermined distance D away from corresponding one of the first plurality of patterns P1 for each cell. This is further illustrated in FIG. 10, a top view to see relative positions across the portion of the substrate from the first edge region 20 to the second edge region 30. As mentioned before, the first plurality of patterns P1, created with pre-compensated positions, have been re-positioned after the thermal treatment process to give an inter-pattern spacing $S_1$ substantially equal to the standard cell dimension. In a specific embodiment, the tip-tip spacing L of the scribe device is configured to form second plurality of patterns P2 for fitting each cell in the designed cell spatial dimension. Therefore, L is substantially the same as $S_1$. In addition, the shifted distance D of P2 relative to P1, or the P1-P2 spacing, would be also substantially a constant for all cells throughout the panel. Embodiments of the present invention using a precompensated P1 substantially help to reduce the occurrence of an enlarged P1-P2 spacing after the thermal treatment processes for forming absorber structure. As the region between patterns P1 and P2 essentially cannot be used for directly converting photons to electrons, it needs to be kept small but a constant. Embodiments of the present invention thus prevent any un-desired enlargement of P1-P2 area. This directly translates to an enhancement in cell efficiency for the photovoltaic panel. At the same time, embodiments of the present invention also reduce the potential risk of un-desired P1-P2 shorting due to the substrate compaction, enhancing the device reliability.

Figure 10:
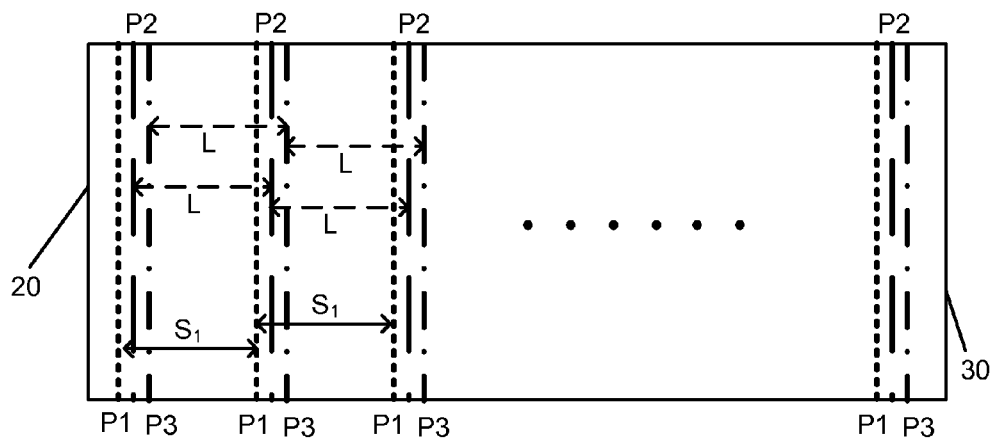

Embodiments of the present invention can be applied further for patterning additional series of patterns P3 or others using the same scribe device 300 having multiple mechanical tips. For example, after forming the second plurality of patterns P2, another transparent conductive material such as TZO material or ITO material can be added using techniques such as sputtering, physical vapor deposition, solution based deposition, MOCVD and others. A third plurality of patterns P3 can be formed with each pattern P3 at a proper lateral distance away from P2 (and of course, some lateral distance away from P1) for each cell on the whole panel. The inter-pattern spacing of the third plurality of patterns P3 can be substantially the same value L or $S_1$, i.e., the same as the standard cell dimension. FIG. 10 shows an exemplary top view of the panel with many cells and each with three sets of patterns respectively with a proper position and spacing. Of course there can be other variations, modifications, and alternatives.

Depending on the embodiment, the present method can also be applied to silicon based photovoltaic devices. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for patterning a thin film photovoltaic panel, the method comprising:

providing a substrate having a first edge opposing to a second edge, the substrate characterized by a compaction parameter;

forming a molybdenum material overlying the substrate;

forming a first plurality of patterns in the molybdenum material configured in a spatial configuration having a first inter-pattern spacing from the first edge to the second edge to form a first patterned structure overlying the substrate, wherein the first inter-pattern spacing is equal to a predetermined standard cell dimension plus an additional distance determined as a function of the compaction parameter;

forming a precursor material comprising at least copper bearing species and indium bearing species overlying the first patterned structure;

subjecting the substrate including the first patterned structure overlaid by the precursor material to one or more thermal processes to form at least an absorber structure and cause the substrate to change in dimension associated with the compaction parameter and subsequently to change the first inter-pattern spacing to a second inter-pattern spacing;

forming a window material overlying the absorber structure; and scribing at least through one or more portions of the window material and the absorber structure at a position on the substrate shifted by a predetermined distance from one of the first plurality of patterns to cause formation of a second plurality of patterns characterized by a third inter-pattern spacing.

2. The method of claim 1 wherein the substrate comprises a glass material configured in substantially a rectangular shape.

3. The method of claim 1 wherein the compaction parameter is a constant independent of a position on the substrate.

4. The method of claim 1 wherein the compaction parameter is a function of a distance from the first edge of the substrate.

5. The method of claim 1 wherein the forming a first plurality of line patterns in the molybdenum material comprises scanning a laser beam to remove a first portion of the molybdenum material, shifting the laser beam position by the first inter-pattern spacing away, and scanning the laser beam to remove a second portion of the molybdenum material.

6. The method of claim 1 wherein the first inter-pattern spacing is determined to compensate a change in dimension of the substrate to be caused by the one or more thermal processes based on the compaction parameter.

7. The method of claim 1 wherein the window material comprises a cadmium sulfide material.

8. The method of claim 1 wherein the scribing at least through one or more portions of the window material and the absorber structure comprises using a scribe device including two or more mechanical tips having a tip-tip separation equal to the third inter-pattern spacing.

9. The method of claim 1 wherein the third inter-pattern spacing is substantially equal to the second inter-pattern spacing.

10. The method of claim 1 wherein the scribing at least through one or more portions of the window material and the absorber structure further comprises forming a recessed region of no greater than 200 Angstroms into the molybdenum material for each of the second plurality of line patterns.

11. The method of claim 1 wherein the one or more thermal processes to form an absorber structure comprises treating the precursor material in a gaseous environment comprising selenium species or sulfur species in one or more predetermined temperature cycles.

12. The method of claim 11 wherein the compaction parameter is derived by subjecting a sample substrate to the one or more predetermined temperature cycles, the sample substrate and the substrate in claim 1 being selected from a same lot of as-formed glass substrates.

13. The method of claim 1 wherein each of the second plurality of patterns is substantially shifted by a same predetermined distance from a corresponding one of the first plurality of patterns.

14. The method of claim 1 further comprising forming a transparent conductive oxide material overlying the second patterned structure.

15. The method of claim 14 further comprising scribing through one or more portions of the transparent conductive material to cause formation of a third plurality of patterns characterized by the third inter-pattern spacing, each of the third plurality of line patterns being shifted by a predetermined second distance from each of the second plurality of patterns.

16. The method of claim 1, wherein the function of compaction parameter equals the product of the compaction parameter and the predetermined standard cell dimension.

17. The method of claim 1, wherein the compaction parameter is between 500 ppm and 600 ppm.

18. A method for pre-compensating patterns on thin film panels, the method comprising:

providing a glass substrate characterized by a compaction ratio, the compaction ratio being dependent on one or more thermal cycles;

forming a first film overlying the glass substrate;

forming a first patterned structure in the first film the first patterned structure characterized by a first plurality of patterns having a first inter-pattern spacing pre-compensated by the compaction ratio;

forming at least a second film overlying the first patterned structure;

processing the second film through the one or more thermal cycles, the one or more thermal cycles transforming the first inter-pattern spacing to a second inter-pattern spacing while the substrate is being subjected to a compaction based on the compaction ratio;

scribing at least two or more portions of the second film using a scribe device to form a second plurality of patterns, the scribe device including two or more mechanical tips having a pre-determined tip-to-tip separation substantially equal to the second inter-pattern spacing, each of the second plurality of patterns being respectively shifted a distance from one of the first plurality of patterns.

* * * * *